US008632700B2

(12) United States Patent
Winoto

(10) Patent No.: US 8,632,700 B2
(45) Date of Patent: Jan. 21, 2014

(54) METHODS AND COMPOSITIONS FOR INK JET DEPOSITION OF CONDUCTIVE FEATURES

(75) Inventor: Adrian Winoto, San Francisco, CA (US)

(73) Assignee: Cambrios Technologies Corporation, Sunnyvale, CA (US)

( * ) Notice: Subject to any disclaimer, the term of this patent is extended or adjusted under 35 U.S.C. 154(b) by 583 days.

(21) Appl. No.: 12/380,293

(22) Filed: Feb. 25, 2009

(65) Prior Publication Data

US 2009/0283304 A1    Nov. 19, 2009

Related U.S. Application Data

(60) Provisional application No. 61/031,528, filed on Feb. 26, 2008.

(51) Int. Cl.
*H01B 1/22*        (2006.01)

(52) U.S. Cl.
USPC .............................. 252/514; 252/512; 977/762

(58) Field of Classification Search
USPC ........................... 252/500, 514, 512; 977/762
See application file for complete search history.

(56) References Cited

U.S. PATENT DOCUMENTS

| | | | |
|---|---|---|---|
| 6,975,067 B2 | 12/2005 | McCormick et al. | |
| 7,018,872 B2 | 3/2006 | Hirai et al. | |
| 7,052,940 B2 | 5/2006 | Lee | |
| 7,062,848 B2 * | 6/2006 | Pan et al. | 29/825 |
| 7,097,788 B2 | 8/2006 | Kirkor et al. | 252/502 |
| 7,630,041 B2 | 12/2009 | Liu et al. | |
| 7,780,876 B2 | 8/2010 | Nakatani | |
| 8,018,563 B2 | 9/2011 | Jones et al. | |
| 8,094,247 B2 | 1/2012 | Allemand et al. | |
| 2004/0038808 A1 | 2/2004 | Hampden-Smith et al. | 502/180 |
| 2005/0074589 A1 | 4/2005 | Pan et al. | |
| 2005/0089679 A1 | 4/2005 | Ittel et al. | 428/323 |
| 2005/0173680 A1 | 8/2005 | Yang | 252/500 |
| 2005/0197419 A1 | 9/2005 | Graziano et al. | |
| 2005/0204956 A1 | 9/2005 | Berkei et al. | |
| 2005/0215689 A1 | 9/2005 | Garbar et al. | |
| 2006/0189113 A1 | 8/2006 | Vanheusden et al. | |
| 2006/0199877 A1 | 9/2006 | Ganapathiappan | |
| 2007/0074316 A1 | 3/2007 | Alden et al. | |
| 2008/0003363 A1 | 1/2008 | Park et al. | |
| 2008/0143906 A1 | 6/2008 | Allemand et al. | |
| 2008/0210052 A1 | 9/2008 | Allemand | |
| 2009/0052029 A1 | 2/2009 | Dai et al. | |
| 2009/0228131 A1 | 9/2009 | Wolk et al. | |

FOREIGN PATENT DOCUMENTS

| | | |
|---|---|---|
| EP | 0 765 704 A2 | 4/1997 |
| EP | 1 138 729 A1 | 10/2001 |
| EP | 1 550 632 A1 | 7/2005 |
| EP | 1 769 867 A1 | 4/2007 |
| JP | 2003-43238 A | 2/2003 |
| JP | 2003-515622 A | 5/2003 |
| JP | 2004-34228 A | 2/2004 |
| JP | 2004-127676 A | 4/2004 |
| JP | 2004-196923 A | 7/2004 |
| JP | 2004-223693 A | 8/2004 |
| JP | 2005-290362 A | 10/2005 |
| JP | 2005-530005 A | 10/2005 |
| JP | 2006-118036 A | 5/2006 |
| JP | 2006-219625 A | 8/2006 |
| JP | 2006-519291 A | 8/2006 |
| JP | 2006-233252 A | 9/2006 |
| JP | 2006-257418 A | 9/2006 |
| JP | 2006-294550 A | 10/2006 |
| JP | 2006-307046 A | 11/2006 |
| JP | 2007-194174 A | 8/2007 |
| JP | 2007-230021 A | 9/2007 |
| JP | 2007-291239 A | 11/2007 |
| JP | 2008-3606 A | 1/2008 |
| JP | 2008-198595 A | 8/2008 |
| JP | 2008-258147 A | 10/2008 |
| JP | 2010-507199 A | 3/2010 |
| JP | 2010-525526 A | 7/2010 |
| JP | 4800609 B2 | 10/2011 |
| WO | 01/39135 A2 | 5/2001 |
| WO | 03/106573 A1 | 12/2003 |
| WO | WO 2004/005413 A1 | 1/2004 |
| WO | 2004/069941 A2 | 8/2004 |
| WO | 2005/099941 A1 | 10/2005 |
| WO | 2006/066033 A1 | 6/2006 |
| WO | 2006/076616 A2 | 7/2006 |
| WO | 2007/022226 A2 | 2/2007 |
| WO | 2008/046058 A2 | 4/2008 |
| WO | 2008/131304 A1 | 10/2008 |
| WO | 2009/018261 A2 | 2/2009 |

OTHER PUBLICATIONS

Sun, Y., et al. "Crystalline Silver Nanowires by Soft Solution Processing," Nano Letters 2(2):165-168, 2002.
Toyobo Vinyl Dept., retrieved May 22, 2013, from http://www.toyobo.co.jp/seihin/xi/vylonal/index.htm, 6 pages.

* cited by examiner

*Primary Examiner* — Mark Kopec
*Assistant Examiner* — Haidung Nguyen
(74) *Attorney, Agent, or Firm* — Seed IP Law Group PLLC

(57) ABSTRACT

Disclosed is an electrically conductive feature on a substrate, and methods and compositions for forming the same, wherein the electrically conductive feature includes metallic anisotropic nanostructures and is formed by injetting onto the substrate a coating solution containing the conductive anisotropic nanostructures.

10 Claims, 14 Drawing Sheets

METHODS AND COMPOSITIONS FOR INK JET DEPOSITION OF CONDUCTIVE FEATURES

CROSS-REFERENCE TO RELATED APPLICATIONS

This application claims the benefit under 35 U.S.C. §119 (e) of U.S. Provisional Patent Application No. 61/031,528 filed Feb. 26, 2008, which application is incorporated herein by reference in its entirety.

BACKGROUND

1. Technical Field

This disclosure is related to formation of conductive features on substrates.

2. Related Art

Transparent conductors refer to thin conductive films coated on high-transmittance surfaces or substrates. Transparent conductors may be manufactured to have surface conductivity while maintaining reasonable optical transparency. Such surface conducting transparent conductors are widely used as transparent electrodes in flat liquid crystal displays, touch panels, electroluminescent devices, and thin film photovoltaic cells, as anti-static layers and as electromagnetic wave shielding layers.

Currently, vacuum deposited metal oxides, such as indium tin oxide (ITO), are the industry standard materials to provide optically transparency and electrical conductivity to dielectric surfaces such as glass and polymeric films. However, metal oxide films are fragile and prone to damage during bending or other physical stresses. They also require elevated deposition temperatures and/or high annealing temperatures to achieve high conductivity levels. There also may be issues with the adhesion of metal oxide films to substrates that are prone to adsorbing moisture such as plastic and organic substrates, e.g. polycarbonates. Applications of metal oxide films on flexible substrates are therefore severely limited. In addition, vacuum deposition is a costly process and requires specialized equipment. Moreover, the process of vacuum deposition is not conducive to forming patterns and circuits. This typically results in the need for expensive patterning processes such as photolithography.

Conductive polymers have also been used as optically transparent electrical conductors. However, they generally have lower conductivity values and higher optical absorption (particularly at visible wavelengths) compared to the metal oxide films, and suffer from lack of chemical and long-term stability.

Recently, transparent conductors formed using conductive nanostructures have been developed and provide some advantages over the types of transparent conductors mentioned above. In particular, transparent conductors formed using conductive nanostructures are relatively flexible, can be fabricated using wet coating processes and can exhibit desirable electrical and optical characteristics. Such transparent conductors and disclosed, for example, in U.S. patent application Ser. Nos. 11/766,552; 11/504,822; 11/871,767; and 11/871,721 which are incorporated by reference herein in their entirety. Additionally, while a number of the device applications mentioned above can use transparent conductive sheets having a relatively large, contiguous conductive area, many of these applications also require layers in which relatively smaller areas, patterns, traces, lines or other such features are conductive. While methods have been developed to pattern nanostructure based transparent conductors, such patterning processes may present manufacturing inefficiencies. Accordingly, there is a need to be able to produce nanostructure based conductive films having conductive patterns or features.

SUMMARY OF THE INVENTION

In a product in accordance with the present invention, an electrically conductive feature is formed on a substrate wherein the electrically conductive feature includes metallic anisotropic nanostructures and the electrically conductive feature is formed by injetting onto the substrate a coating solution containing the conductive anisotropic nanostructures.

Further a coating composition in accordance with the present invention usable for producing an electrically conductive feature on a substrate by ink jetting including a first solvent, a second solvent, a surfactant and metallic, anisotropic nanostructures.

Additionally a method of forming a conductive feature on a substrate in accordance with the present invention includes providing a coating solution containing metallic anisotropic nanostructures, ink jetting a plurality of first drops onto the substrate having interdrop spaces therebetween, allowing the plurality of first drops to dry, ink jetting a plurality of second drops onto the substrate into the interdrop spaces between the plurality of first drops, and allowing the plurality of second drops to dry such that an electrically conductive path is formed between at least a first and second ones of the plurality of first drops.

DETAILED DESCRIPTION

Figure 1:
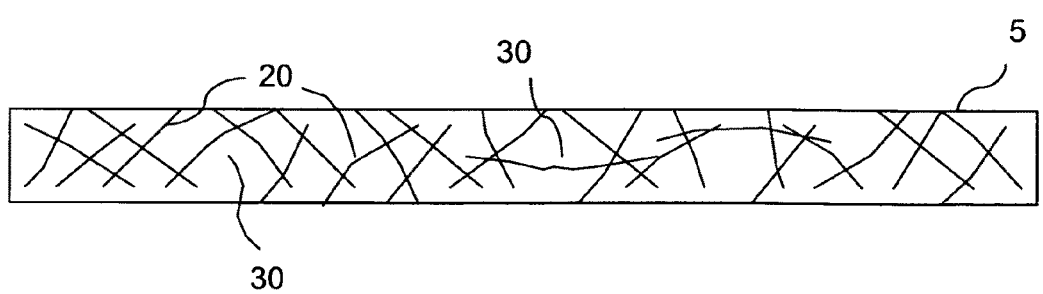
FIG. 1 is a drawing of a conductive feature including anisotropic nanostructures above a percolation threshold in accordance with the present invention.

In accordance with the present invention, transparent conductive patterns can be formed on a substrate by ink jet printing of coating solutions including conductive nanostructures. Ink jet printing is a method of printing that propels droplets of liquid coating solution (or "ink") onto a substrate. The droplets are forced through a nozzle, or multiple nozzles, on an ink jet head typically either by thermal or piezoelectric means. In doing so, coating solutions and methods of ink jetting must achieve jettability of coating solution and reproducibility of drops and patterns of drops on a coated substrate. In particular, in methods, coating solutions and apparatus for ink jetting conductive patterns or traces including nanowires and/or nanotubes in accordance with the present invention, coating solutions should not dry on the ink jet nozzle, the coating solution should flow through the nozzle or nozzles with minimal clogging, drops of coating solution emitted from the ink jet head should form a stable interaction with the substrate and should dry sufficiently quickly on the substrate.

Conductive Nanostructures

Coating solutions in accordance with the present invention preferably include electrically conductive nanostructures. As used herein, "nanostructures" generally refer to nano-sized structures, at least one dimension of which is less than 500 nm, more preferably, less than 250 nm, 100 nm or 25 nm. Preferably, the nanostructures used in a coating solution in accordance with the present invention are anisotropically shaped, that is, they have an aspect ratio (ratio of length to diameter) that is not equal to one. Use of isotropic nanostructures in producing transparent conductive features can be difficult because relatively high weight percents (or surface loading levels) of such nanostructures may be necessary to achieve desired levels of conductivity. Such high loading levels can unacceptably impact optical characteristics such as haze (e.g. cause generally higher haze) and transparency (e.g. cause generally lower transparency). However, use of anisotropic nanostructures in ink jetting applications can be challenging because the length of the nanostructures can relatively more easily clog an ink jet nozzle or otherwise cause unacceptable jetting. Methods and coating solutions in accordance with the present invention advantageously overcome these difficulties.

The nanostructures can be solid or hollow. Solid anisotropic nanostructures include, for example, nanowires. Hollow anisotropic nanostructures include, for example, nanotubes. Typically, anisotropic nanostructures have a diameter from 5 to 500 nm, more preferably from 10 to 100 nm, and more preferably from 30 to 90 nm with length from 100 nm to 10 um. and more preferably from 500 nm to 1 um.

The nanostructures can be formed of any conductive material. Most typically, the conductive material is metallic. Semiconductive or non-conductive nanostructures generally don't perform well with the methods and apparatus disclosed herein to produce transparent, conductive features on a substrate because relatively high percentages of such materials may need to be used to achieve acceptable conductivity. And, such relatively high amounts may negatively affect the optical properties of a produced feature. The metallic material can preferably be a pure metal, metal alloy or a bimetallic material, which comprises two or more types of metal. Suitable metals include, but are not limited to, silver, gold, copper, nickel, gold-plated silver, platinum and palladium. It is also considered that small amount of oxide caused by atmospheric oxidation of metals may also be present.

Conductive anisotropic nanostructures can preferably be used as the primary conductive medium in a coating solution in accordance with the present invention. A preferred type of anisotropic metallic nanostructures includes metal nanowires. Metal nanowires are nanowires formed of metal, metal alloys, or plated metals. Suitable metal nanowires include, but are not limited to, silver nanowires, gold nanowires, copper nanowires, nickel nanowires, gold-plated silver nanowires, platinum nanowires, and palladium nanowires. Co-pending and co-owned U.S. application Ser. Nos. 11/766,552, 11/504,822, 11/871,767, and 11/871,721 describe methods of preparing metal nanowires (e.g., silver nanowires), the descriptions of which are incorporated herein by reference in their entireties.

Another preferred type of anisotropic metallic nanostructures used in the primary conductive medium includes metal nanotubes. Co-pending and co-owned U.S. Patent Application No. 61/031,643, filed Feb. 26, 2008, describes methods of preparing metal nanotubes (e.g., gold nanotubes) the description of which is incorporated herein by reference in their entireties.

In various embodiments, the conductive nanowires are about 5-100 μm long and 5-100 nm in diameter (or cross-section). In certain embodiments, the nanowires are about 5-30 μm long and 20-80 nm in diameter. In a preferred embodiment, the nanowires (e.g., silver nanowires) are about 20 μm long and 50 nm in diameter. Suitable nanotubes have similar dimensions as those described for nanowires. For nanotubes, the diameter refers to the outer diameter of the nanotubes.

Conductive Features

In a conductive feature formed on a substrate, anisotropic nanostructures form a conductive network through a percolation process. Percolative conductivity can be established when a conductive path is formed through interconnecting anisotropic nanostructures. Sufficient nanostructures must be present to reach an electrical percolation threshold and become conductive. The electrical percolation threshold is therefore a value related to the loading density or concentration of the nanostructures, above which long range connectivity can be achieved. Typically, the loading density refers to the number of nanostructures per area, which can be represented by "number/$\mu m^2$".

As described in co-pending U.S. patent application Ser. No. 11/504,822, the higher the aspect ratio of the anisotropic nanostructures, the fewer nanostructures are needed to achieve percolative conductivity. For anisotropic nanostructures, such as nanowires or nanotubes, the electrical percolation threshold or the loading density is inversely related to the length$^2$ (length squared) of the nanowires or nanotubes. Co-pending and co-owned application Ser. No. 11/871,053, which is incorporated herein by reference in its entirety, describes in detail the theoretical as well as empirical relationship between the sizes/shapes of the anisotropic nanostructures and the surface loading density at the percolation threshold.

FIG. 1 shows schematically a conductive feature 5 on the surface of a substrate (not shown) wherein a conductive network is formed by conductive anisotropic nanostructures 20 at or above an electrical percolation threshold. Conductive paths are formed by interconnecting nanostructures 20 (e.g., a path can be traced from one end of the network to the other through connecting nanostructures). An electrical current can therefore be carried across the anisotropic nanostructures network.

As used herein, "conductive network" or "network" refers to an interconnecting network formed by conductive nanostructures above an electrical percolation threshold. Typically, a conductive network has surface resistivity of no higher than $10^8$ ohms/square (also referred to as "$\Omega/\square$"). Preferably, the surface resistivity is no higher than $10^4\Omega/\square$, $3{,}000\Omega/\square$, $1{,}000\Omega/\square$ or $100\Omega/\square$. Typically, the surface resistivity of a conductive network formed by metal nanowires or nanotubes is in the ranges of from $10\Omega/\square$ to $1000\Omega/\square$, from $100\Omega/\square$ to $750\Omega/\square$, $50\Omega/\square$ to $200\Omega/\square$, from $100\Omega/\square$ to $500\Omega/\square$, or from $100\Omega/\square$ to $250\Omega/\square$, or $10\Omega/\square$ to $200\Omega/\square$, from $10\Omega/\square$ to $50\Omega/\square$, or from $1\Omega/\square$ to $10\Omega/\square$. Such resistance ranges are as taken by a two point resistance probes contacting opposite ends of a conductive feature and dividing the resultant resistance by the number of squares making up the feature. For example, a feature that is 100 um long and 1 um wide would be made up of 100 squares.

Also shown in FIG. 1, the anisotropic nanostructures define inter-wire spaces 30. At above the percolation threshold, the size of the inter-wire space (also referred to as "mesh size") correlates to the conductivity of the network. Typically, smaller mesh size means more densely distributed nanowires, which in turn correspond to higher conductivity.

Figure 2:
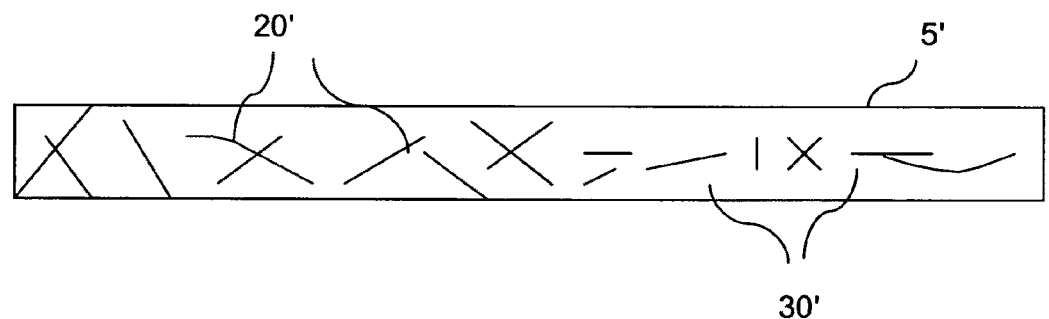
FIG. 2 is a drawing of a feature including anisotropic nanostructures below a percolation threshold.

Mesh size can also be used as an indicator of the nanostructures surface loading level. For example, for anisotropic nanostructures of a given length, lower surface loading will result in larger mesh size. When the mesh size is above certain threshold value, the nanostructures can become too far apart such that percolation is no longer possible and the inter-wire spaces effectively become insulators. FIG. 2 shows a feature 5' in which an nanostructures 20' are at an insufficient density to form a complete network. The inter-wire spaces 30' become insulating. Stately differently, due to the lower density of the nanostructures as compared to that in FIG. 1, the mesh size has enlarged and the conductivity between nanostructures is disrupted.

Printing Methods

Figure 3:
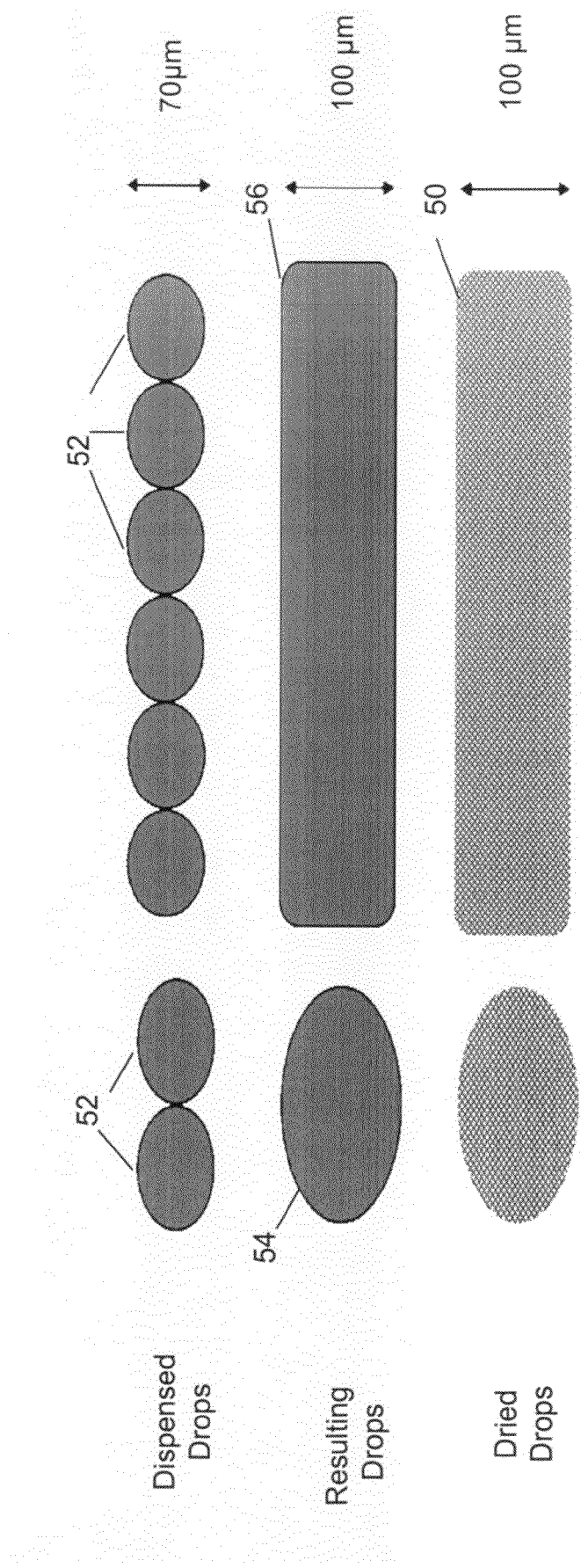
FIG. 3 is a drawing illustrating one embodiment of a method in accordance with the present invention of producing conductive features by ink jetting coating solution having conductive nanostructures.

FIG. 3 illustrates one embodiment of a method of producing a conductive feature 50 by ink jetting a coating solution including conductive anisotropic nanostructures in accordance with the present invention.

As shown dispensed drops 52 are laid down such that adjacent drops substantially touched one other. Though dispensed drops may be any producible diameter, FIG. 3 shows dispensed drops having a diameter of approximately 70 um. After application to the substrate, but before drying, the dispensed droplets tend to flow together to form slightly larger diameter dispensed drops 54, which form a dispensed line 56. As an example of how resulting drops 54 and dispensed line 56 have a slightly larger diameter than dispensed drops 52, the resulting drops 54 can have a diameter of approximately 100 um and dispensed line can have a width of approximately 100 um. After drying, dispensed line 56 becomes feature line 50, which, as an example, can have a width of approximately 100 um.

It was found that the conductivity of a feature such as feature line 50 could be altered by depositing additional layers of coating solution on top of a feature. In particular, after laying down first feature 50, in one embodiment a second and subsequent ink jet head passes can be made along the same path and operating with the same parameters as used to generate feature 50. In this way, multiple layers of coating solution can be built up on feature 50. Generally, depositing multiple layers as described above resulted in a feature having relatively lower resistivity but, as discussed below, may also result in a feature having lower light transmission and higher optical haze.

Figure 4:
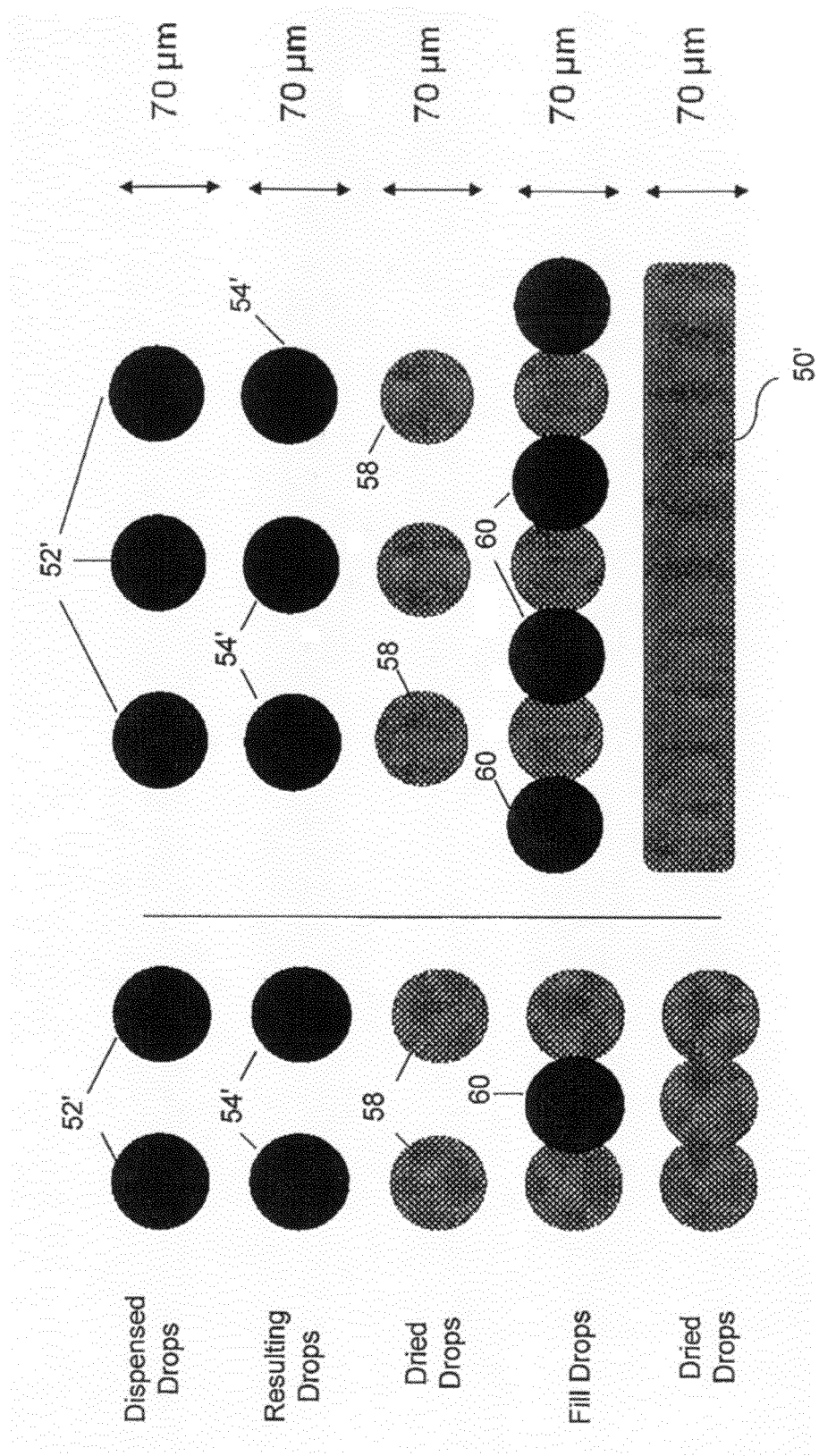
FIG. 4 is a drawing illustrating a second embodiment of a method in accordance with the present invention of producing conductive features by ink jetting coating solution having conductive nanostructures.

FIG. 4 is a drawing illustrating a second embodiment of a method of producing a conductive feature 50' by ink jetting a coating solution including conductive anisotropic nanostructures in accordance with the present invention. In the method of FIG. 4, dispensed drops 52' are laid down such that adjacent drops do not touch each other. Additionally, dispensed drops are preferably dispensed having approximately a drop's diameter between the closest edge of adjacent drops. In the example shown in FIG. 4, and with the understanding that any producible diameter and inter-drop spacing is within the scope of the present invention, the dispensed drops 52' have a diameter of approximately 70 um and are laid down at approximately 70 um intervals between the closest edges of adjacent drops. As such, adjacent drops do not touch and flow together to form larger drops and resulting drops 54' are also, in the example of FIG. 4, of approximately 70 um diameter. Resulting drops 54' are then allowed to dry to form dried drops 58 also having, in the example of FIG. 4, a diameter of approximately 70 um. A second pass of the ink jet head is then taken along the same line and fill drops 60 are dispensed in the spaces between dried drops 58. In the example of FIG. 4, fill drops 60 have a diameter of approximately 70 um and are dispensed to have an approximately 70 um space between the closest edges of adjacent drops, though any producible diameter drop with any inter-drop spacing is within the scope of the present invention. Because fill drops are not laid down touching each other, they do not flow together to form larger drops. Thus, resulting line feature 50' has a width of approximately 70 um as opposed to the approximately 100 um width of line feature 50 shown in FIG. 3.

Figure 5:
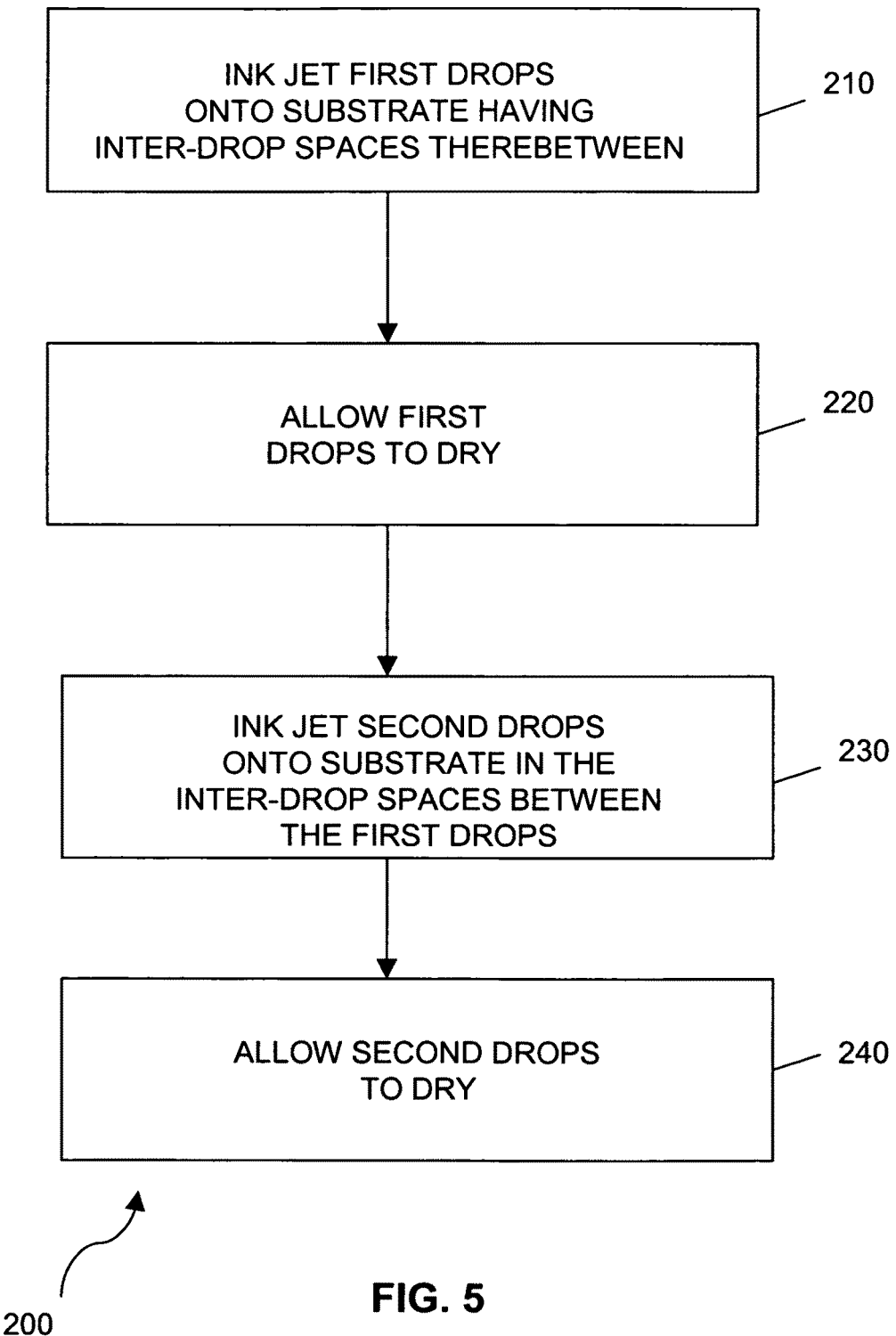
FIG. 5 is a flow chart showing the method illustrated by FIG. 4.

FIG. 5 is a flow chart showing the method illustrated in FIG. 4. In step 210, a plurality of first drops are ink jetted onto the surface of a substrate such that the drops are not touching each other and have inter-drop spaces therebetween. In step 220, the first drops are allowed to dry. Then, in step 230, a plurality of second drops are ink jetted onto the substrate to fill in the inter-drop spaces formed by the first drops. The second drops are then allowed to dry. In this way, a conductive trace can be formed as described herein.

As noted above, the method illustrated in FIGS. 4 and 5 can also be used to generate features having different widths than line 50'. This can be done using different sized ink jet nozzles. In particular, as discussed below in the examples, an approximately 70 um width line can be generated using 10 pL (27 um diameter) nozzles. However, if 1 pL (9 um diameter) nozzles are used with an inter-drop spacing of approximately 30 um was used a final feature line width of approximately 45 nm can be produced.

Additionally, the method illustrated in FIGS. 4 and 5 may be carried out repeatedly in multiple passes over the same location on the substrate to build up multiple layers of coating solution in a single feature. Generally, depositing multiple layers as described above resulted in a feature having relatively lower resistivity. It was also found that more layers were necessary to generate a feature of a given resistivity when using a smaller diameter nozzle than when using a larger diameter nozzle. It is believed this is because the smaller diameter nozzle results in reduced volume of dispensed coating solution per pass which results in reduced conductive material per pass.

Coating Solution Formulations

As discussed above, in order to generate a surface features that are electrically conducting, it is important that the anisotropic nanostructure loading level be sufficient to form a percolative network in the feature. Accordingly, the amount of anisotropic nanostructures in a coating solution is important to be able to produce an electrically conductive surface feature.

Further, a high enough boiling point should be provided such that no drying of the coating solution on the nozzle of an ink jet head occurs. However, in general, a high boiling point solution can require greater time to dry on a substrate. And, in a production environment where multiple steps are carried out on a single substrate, which can include multiple ink jet coating passes, increased drying time can reduce throughput. Accordingly, it can be important for a boiling point of a coating solution to also be low enough so that the drying of emitted drops on the substrate is not too slow to reduce production throughput. In one embodiment, an ink jettable coating solution including nanowires and/or nanotubes in accordance with the present invention preferably has a boiling point above 100 C and below 180 C.

As discussed below, a coating solution in accordance with the present invention preferably includes a surfactant. It was found that too low an amount of surfactant did not produce a good drop shape, that is, the drops could be elongated or random, non-circular shape. Such irregular shaped drops could make relatively difficult the sizing and shape of a conductive feature formed on a substrate. However, if too much surfactant were used, the trajectory out of the ink jet nozzles, which is preferably substantially along a longitudinal axis of the nozzle, could be at an angle to such longitudinal axis. Such a dispensing trajectory can make it relatively difficult to create a feature in a desired location on a substrate. In one embodiment a conductive coating solution in accordance with the present invention preferably includes from 200 ppm to 800 ppm surfactant and more preferably includes from 400 ppm to 600 ppm surfactant.

Moreover, the weight percent of conductive nanostructures, e.g. nanowires or nanotubes, present in a coating solution is important to jettability. In particular, too high a volume percent of nanostructures can cause nozzle clogging and misfire either at initial dispensing or over time as coating fluid was dispensed. In one embodiment a conductive coating solution in accordance with the present invention preferably includes, by weight, from 0.1% and 5% conductive nanostructures and more preferably between 0.5% and 1.5% conductive nanostructures.

An ink-jettable coating solution including nanowires and/or nanotubes in accordance with the present invention preferably includes one or more of the following: water, an alcohol, a ketone, ethers, hydrocarbons or an aromatic solvent (benzene, toluene, xylene, etc.) and nanowires and/or nanotubes.

More preferably, an ink jettable coating solution including nanowires and/or nanotubes in accordance with the present invention includes a first solvent, a second solvent a surfactant and nanowires and/or nanotubes. Representative examples of suitable surfactants include Zonyl® FSA, Zonyl® FSN, Zonyl® FSO, Zonyl® FSH, Triton (x100, x114, x45), Dynol (604, 607), n-Dodecyl b-D-maltoside and Novek. Examples of suitable solvents (either first or second solvents) include water, isopropanol, propylene glycol, and ethylene glycol. In a preferred embodiment of a coating solution in accordance with the present invention includes, by weight, from 35% to 75% of a first solvent, which may, for example, be propylene glycol; from 25% to 65% by weight of a second solvent, which may, for example, be water; from 0.005% to 0.5% by weight surfactant, which may, for example, be Zonyl FSO; and from 0.1% to 5% by weight metallic nanostructures, which may, for example, be silver nanowires or gold nanotubes. More preferably, an embodiment of a coating solution in accordance with the present invention includes, by weight, from 50% to 60% of a first solvent, which may, for example, be propylene glycol; from 40% to 50% by weight of a second solvent, which may, for example, be water; from 0.005% to 0.5% by weight surfactant, which may, for example, be Zonyl FSO; and from 1% to 2% by weight metallic nanostructures, which may, for example, be silver nanowires and/or gold nanotubes. Another embodiment of a coating solution in accordance with the present invention may have a ratio by weight of first solvent to metallic nanostructures of from 7 to 750; a ratio by weight of a second solvent to metallic nanostructures of from 5 to 650; and a ratio by weight of surfactant of from 0.001 to 5. In such embodiment the first solvent may, for example, be propylene glycol, the second solvent may, for example, be water, the surfactant may, for example, be Zonyl FSO and the metallic nanostructures may, for example, be silver nanowires and/or gold nanotubes. Another embodiment of a coating solution in accordance with the present invention may have a ratio by weight of first solvent to metallic nanostructures of from 25 to 60; a ratio by weight of a second solvent to metallic nanostructures of from 40 to 50; and a ratio by weight of surfactant of from 0.00 to 0.1. In such embodiment the first solvent may, for example, be propylene glycol, the second solvent may, for example, be water, the surfactant may, for example, be Zonyl FSO and the metallic nanostructures may, for example, be silver nanowires and/or gold nanotubes.

In addition, a coating solution in accordance with the present invention may contain additives and binders to control viscosity, corrosion, adhesion, and nanowire dispersion. Examples of suitable additives and binders include, but are not limited to, carboxy methyl cellulose (CMC), 2-hydroxy ethyl cellulose (HEC), hydroxy propyl methyl cellulose (HPMC), methyl cellulose (MC), poly vinyl alcohol (PVA), tripropylene gylcol (TPG), and xanthan gum (XG), and surfactants such as ethoxylates, alkoxylates, ethylene oxide and propylene oxide and their copolymers, sulfonates, sulfates, disulfonate salts, sulfosuccinates, phosphate esters, and fluorosurfactants (e.g., Zonyl® by DuPont).

In addition to the composition of the coating solution, the temperature of the ink jet nozzles during dispensing can be important in acceptably jettability. In particular, if nozzle temperatures are too low, the ink jet nozzles can clog and indefinite shaped drops can be produced. Preferably, nozzle temperatures for ink jetting coating solutions containing anisotropic nanostructures in accordance with the present invention are from 45° C. to 65° C. and more preferably from 50° C. to 60° C.

Printing Conditions—Substrate

As used herein, "Substrate", or "substrate of choice", refers to a material onto which the conductive features are coated. The substrate can be rigid or flexible. The substrate can be clear or opaque. Suitable rigid substrates include, for example, glass, polycarbonates, acrylics, and the like. Suitable flexible substrates include, but are not limited to: polyesters (e.g., polyethylene terephthalate (PET), polyester naphthalate, and polycarbonate), polyolefins (e.g., linear, branched, and cyclic polyolefins), polyvinyls (e.g., polyvinyl chloride, polyvinylidene chloride, polyvinyl acetals, polystyrene, polyacrylates, and the like), cellulose ester bases (e.g., cellulose triacetate, cellulose acetate), polysulphones such as polyethersulphone, polyimides, silicones and other conventional polymeric films. Additional examples of suitable substrates can be found in, e.g., U.S. Pat. No. 6,975,067.

To reproducibly generate a conductive feature of a given size on a substrate via an ink jet application process, it can be important to produce ink jet drops of uniform size and shape. In accordance with the present invention, treating a target substrate with either UV Ozone or O2 plasma prior to ink jet deposition of a coating solution on the substrate can advantageously result in relatively greater uniformity of ink jet drop size and shape.

Matrix or Overcoat

After deposition of conductive features onto a substrate, in certain embodiments, it may be preferably to deposit and overcoat or matrix on top of the conductive features. Overcoat or matrix refers to a solid-state material into which conductive nanostructures are dispersed or embedded. Portions of the anisotropic nanostructures may protrude from the overcoat or matrix material to enable access to the conductive network. The overcoat or matrix can act as a host for the nanostructures. The overcoat or matrix can protect the metal nanowires from adverse environmental factors, such as corrosion and abrasion. In particular, the matrix can significantly lower the permeability of corrosive elements in the environment, such as moisture, trace amount of acids, oxygen, sulfur and the like. In addition, the overcoat or matrix offers favorable physical and mechanical properties to the conductive features. For example, it can provide adhesion to the substrate. Furthermore, unlike metal oxide films, polymeric or organic matrices embedded with nanostructures are robust and flexible.

Moreover, the optical properties of the conductive layer can be tailored by selecting an appropriate matrix material. For example, reflection loss and unwanted glare can be effectively reduced by using a matrix of a desirable refractive index, composition and thickness.

Typically, the matrix is an optically clear material. A material is considered "optically clear" or "optically transparent", if the light transmission of the material is at least 80% in the visible region (400 nm-700 nm). Unless specified otherwise, all the layers (including the substrate and the anisotropic nanostructure layer) in a transparent conductor described herein are preferably optically clear. The optical clarity of the matrix is typically determined by a multitude of factors, including without limitation: the refractive index (RI), thickness, consistency of RI throughout the thickness, surface (including interface) reflection, and haze (a scattering loss caused by surface roughness and/or embedded particles).

In certain embodiments, the matrix is about 10 nm to 5 μm thick, about 20 nm to 1 μm thick, or about 50 nm to 200 nm thick. In other embodiments, the matrix has a refractive index of about 1.3 to 2.5, or about 1.35 to 1.8. In certain embodiments, the matrix is a polymer, which is also referred to as a polymeric matrix. Optically clear polymers are known in the art. Examples of suitable polymeric matrices include, but are not limited to: polyacrylics such as polymethacrylates (e.g., poly(methyl methacrylate)), polyacrylates and polyacrylonitriles, polyvinyl alcohols, polyesters (e.g., polyethylene terephthalate (PET), polyester naphthalate, and polycarbonates), polymers with a high degree of aromaticity such as phenolics or cresol-formaldehyde (Novolacs®), polystyrenes, polyvinyltoluene, polyvinylxylene, polyimides, polyamides, polyamideimides, polyetherimides, polysulfides, polysulfones, polyphenylenes, and polyphenyl ethers, polyurethane (PU), epoxy, polyolefins (e.g. polypropylene, polymethylpentene, and cyclic olefins), acrylonitrile-butadiene-styrene copolymer (ABS), cellulosics, silicones and other silicon-containing polymers (e.g. polysilsesquioxanes and polysilanes), polyvinylchloride (PVC), polyacetates, polynorbornenes, synthetic rubbers (e.g., EPR, SBR, EPDM), and fluoropolymers (e.g., polyvinylidene fluoride, polytetrafluoroethylene (TFE) or polyhexafluoropropylene), copolymers of fluoro-olefin and hydrocarbon olefin (e.g., Lumiflon®), and amorphous fluorocarbon polymers or copolymers (e.g., CYTOP® by Asahi Glass Co., or Teflon® AF by Du Pont).

In other embodiments, the polymeric matrix described herein comprises partially polymerized or partially cured polymer. Compared to a fully polymerized or fully cured matrix, a partially cured matrix has lesser degree of cross-linking and/or polymerization and lower molecular weight. Thus, the partially polymerized matrix can be etched under certain conditions and patterning is possible using conventional photolithography. Under a proper polymerization condition, the partially cured matrix may be further cured whereby further cross-linking and polymerization are carried out to provide a matrix of higher molecular weight than that of a partially cured matrix. The partially cured matrix can be etched, followed by a further curing step, to provide a patterned and fully-cured transparent conductor film. Examples of suitable partially cured polymers include, but are not limited to partially cured acrylate, silicone-epoxy, siloxane, novolac, epoxy, urethane, silsesquioxane or polyimide.

In further embodiments, the matrix is an inorganic material. For example, a sol-gel matrix based on silica, mullite, alumina, SiC, MgO—$Al_2O_3$—$SiO_2$, $Al_2O_3$—$SiO_2$, MgO—$Al_2O_3$—$SiO_2$—$Li_2O$ or a mixture thereof can be used. In certain embodiments, the matrix itself is conductive. For example, the matrix can be a conductive polymer. Conductive polymers are well known in the art, including without limitation: poly(3,4-ethylenedioxythiophene) (PEDOT), polyanilines, polythiophenes, and polydiacetylenes.

Electrical and Optical Properties

Transparent conductive features produced using methods and coating solutions having electrically conductive nanostructures can have light transmission of at least 50%, at least 60%, at least 70%, at least 80%, at least 85%, at least 90%, or at least 95% (using air as reference). Haze in an index of light scattering. It refers to the percentage of the quantity of light separated from the incident light and scattered during transmission (i.e. transmission haze). Unlike light transmission, which is largely a property of the medium, haze is often a production concern and is typically caused by surface roughness and embedded particles or compositional heterogeneities in the medium. In various embodiments, the haze of the transparent conducting features is no more than 10%, no more than 8%, no more than 5%, no more than 3%, no more than 2% or no more than 1%.

As discussed herein, a conductive feature in accordance with the present invention includes an interconnecting network of nanostructures above an electrical percolation threshold. Typically, conductive features in accordance with the present invention have a resistivity of no higher than $10^8$ ohms/square (also referred to as "Ω/☐"). Preferably, the resistivity is no higher than $10^4$Ω/☐, 3,000Ω/☐, 1,000Ω/☐ or 100Ω/☐. Typically, the resistivity is in the ranges of from 10Ω/☐ to 1000Ω/☐, from 100Ω/☐ to 750Ω/☐, 50Ω/☐ to 200Ω/☐, from 100Ω/☐ to 800Ω/☐, or from 100Ω/☐ to 250Ω/☐, or 10Ω/☐ to 200Ω/☐, from 10Ω/☐ to 50Ω/☐, or from 1Ω/☐ to 10Ω/☐.

As discussed above, a conductive feature can be formed on a substrate by layering multiple coats of coating solution onto the substrate when forming a single feature. While such multiple layering generally decreases the resistivity of the feature, it can also increase the haze and decrease the transmission of the feature.

Additionally, the percent solids contained in an applied coating solution, that is, the percent of the total volume of coating solution that is conductive nanostructure, can effect the optical properties of the resulting conductive feature. In particular, the higher the percent solids of a coating solution, the thicker the feature widths can be.

Applications

A substrate having transparent conductive features produced using the ink jetting methods and apparatus disclosed herein can be used as electrodes in a wide variety of devices, including any device that currently makes use of transparent conductors such as metal oxide films. Examples of suitable devices include flat panel displays such as LCDs, plasma display panels (PDP), color filters for colored flat panel displays, touch screens, electromagnetic shielding, functional glasses (e.g., for electrochromic windows), optoelectronic devices including EL lamps and photovoltaic cells, and the like. In addition, the transparent conductive features herein can be used in flexible devices, such as flexible displays and touch screens.

(a) Liquid Crystal Display

An LCD is a flat panel display that displays an image by controlling light transmissivity by an external electric field. Typically, the LCD includes a matrix of liquid crystal cells (or "pixels"), and a driving circuit for driving the pixels. Each liquid crystal cell is provided with a pixel electrode for applying an electric field to the liquid crystal cell with respect to a common electrode. If each of the pixel electrodes is connected to a thin film transistor (TFT) together they function as a switching device, i.e., the pixel electrode drives the liquid crystal cell in accordance with a data signal applied via the TFT.

The TFT LCD panel comprises two substrates with the liquid crystal cells interposed in between. The pixel electrodes are provided on a lower substrate for each liquid crystal cell, whereas the common electrode is integrally formed on the entire surface of an upper, opposing substrate. The lower substrate, also referred to as a TFT array substrate or TFT backplane, thus comprises an array of thin film transistors connected to corresponding pixel electrodes. The upper opposing substrate, comprises the common electrode which may be coated on a color filter which combination may be referred to as the color filter substrate.

Conventionally, the pixel electrode is made of a highly transmissive ITO film in order to allow sufficient light to transmit through. As noted above, ITO films are costly to fabricate and may be susceptible to cracking if used on a flexible substrate. The anisotropic nanostructure-based transparent conductor features described herein offer an alternative approach in TFT pixel electrode fabrication.

Generally speaking, the thin film transistors described herein can be fabricated according to any known methods in the art. The nanowire-based pixel electrode can be formed by ink jetting features of the TFT back-plane with an anistropic nanostructure transparent, conductive coating.

The nanostructure-based transparent conductive features disclosed herein are compatible with all the TFT configurations currently used in the LCD technology. In general, thin film transistors fall into two broad categories: a bottom-gate type and a top-gate type. In the bottom-gate TFT, a gate electrode is disposed below an active layer, whereas in the top-gate TFT, a gate electrode is disposed above an active layer. The bottom-gate thin-film transistors typically have superior reliability in comparison with the top-gate thin-film transistor. These structural configurations are described in more detail in, for example, Modern Liquid Crystal Process Technologies '99 (Press Journal, 1998, pp. 53 to 59) and Flat Panel Display 1999 (Nikkei BP, 1998, pp. 132 to 139). Moreover, depending on the type of material that forms the active area, thin film transistors can also be based on amorphous silicon, polycrystalline silicon and organic semiconductors.

Figure 11:
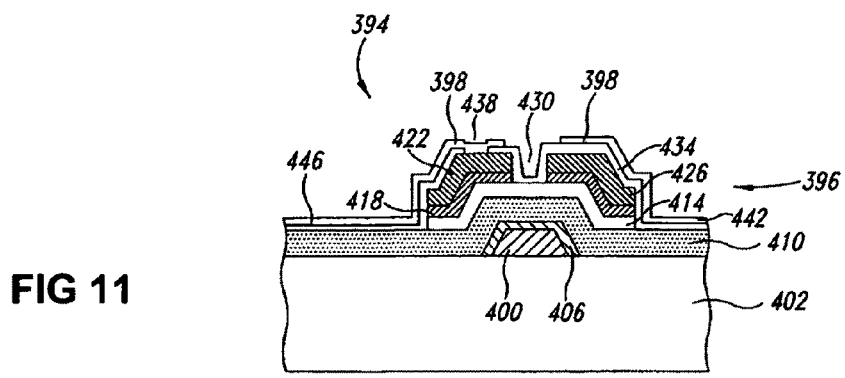
FIG. 11 is a cross-sectional view of a switching device of a TFT backplane according to one embodiment.

FIG. 11 shows the cross-sectional view of a switching device of a TFT backplane according to one embodiment. As shown, the switching device 394 comprises a bottom-gate thin film transistor 396 and a nanostructure-based pixel electrode 398. The thin film transistor includes a gate electrode 400 formed on a substrate 402. The gate electrode can be a metal layer (e.g., Mo—Al—Cd) defined by photolithography. A gate insulating layer 406 overlies the gate electrode 400. The thin film transistor 396 further includes an insulating layer 410, a first semiconductor layer 414 (e.g., amorphous silicon) and a second semiconductor layer 418 (e.g., n+ doped amorphous silicon), all defined to form an island-shaped structure. A source electrode 422 and a drain electrode 426 define a channel 430, exposing a portion of the first semiconductor layer 414 (i.e., active layer). A further protective layer 434 covers the island structure, the source and drain electrodes while exposing a contact hole 438. The protective layer 434 is, for example, a silicon nitride layer. Nanostructure-based transparent conductive features 442 is coated over the thin film transistor 396 in a pattern to form the pixel electrode 398. In other portions of the TFT backplane, the same nanostructure-based transparent conductor features 442 can also be patterned to define a signal line area 446.

In a further embodiment, the switching device described above can be incorporated in a liquid crystal display (LCD) device.

Figure 12:
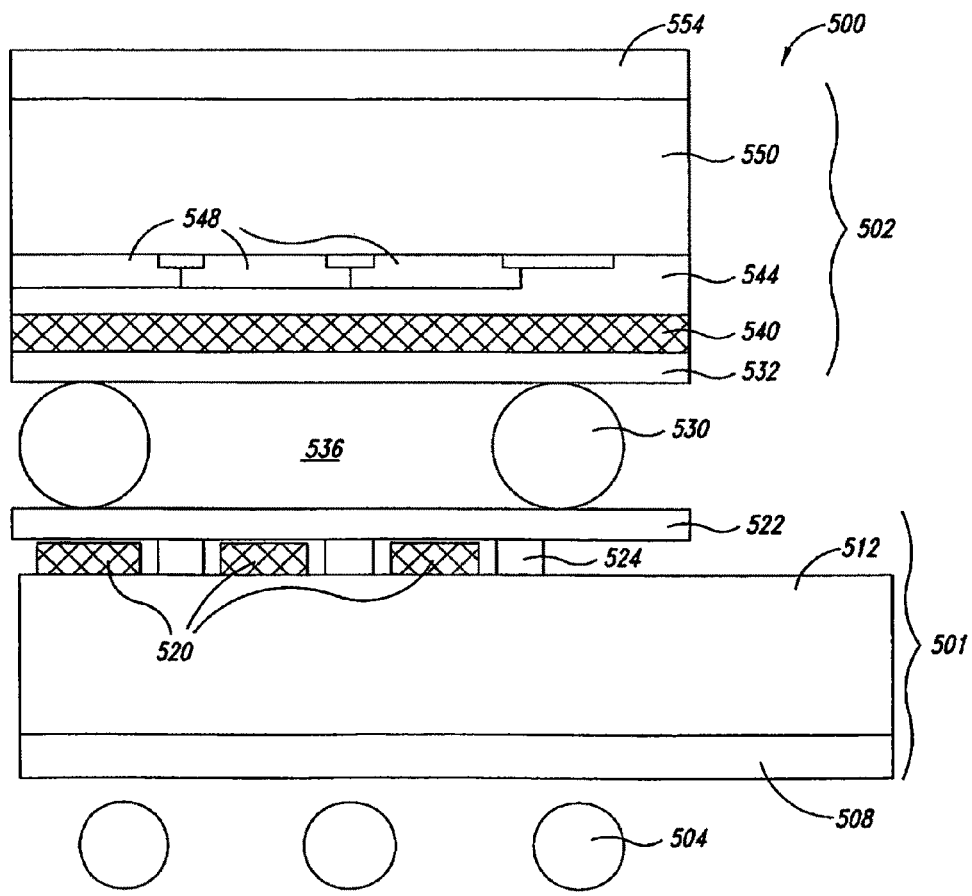
FIG. 12 shows a display device comprising transparent electrodes based on nanostructures in accordance with the present invention.

FIG. 12 shows schematically an LCD device 500 comprising a TFT backplane 501 and a color filter substrate 502. A backlight 504 projects light through a polarizer 508 and a glass substrate 512. A plurality of first transparent conductor strips 520 are positioned between the bottom glass substrate 512 and a first alignment layer 522 (e.g., a polyimide layer). Each transparent conductor strip 520 alternates with a data line 524. Spacers 530 are provided between the first alignment layer 522 and a second alignment layer 532, the alignment layers sandwiching liquid crystals 536 in between. A plurality of second transparent conductor strips 540 are positioned on the second alignment layer 532, the second transparent conductor strips 540 orienting at a right angle from the first transparent conductor strips 520. The second transparent conductor strips 540 are further coated with a passivation layer 544, a color filter of colored matrices 548, a top glass substrate 550 and a polarizer 554. Advantageously, the transparent conductor strips 520 and 540 can be formed using transparent conductive features disclosed herein ink jetted onto the bottom glass substrate, and the alignment layer, respectively. Unlike the conventionally employed metal oxide strips (ITO), no costly deposition or etching processes are required.

Figure 13:
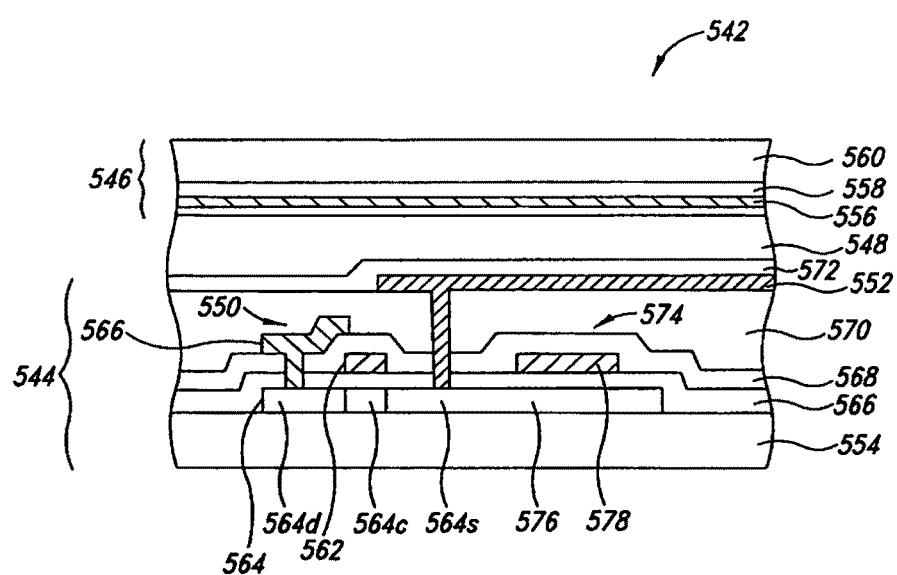
FIG. 13 shows a cross-sectional view of a LCD based on a top-gate TFT according to one embodiment.

FIG. 13 shows a cross-sectional view of a LCD based on a top-gate TFT according to another embodiment. As shown, the LCD 542 has a TFT substrate 544 and a color filter substrate 546 with a liquid crystal layer 548 interposed between them. As noted above, in the TFT substrate 544, thin film transistors 550 and pixel electrodes 552 are arranged in a matrix configuration on a bottom transparent substrate 554. A common electrode 556, to which a common voltage can be supplied and a color filter 558 are disposed on a top transparent substrate 560. A voltage applied between the pixel electrode 552 and the common electrode 556, which are facing each other with the liquid crystal 548 between them, drives the liquid crystal cells (pixels).

The thin film transistor 550 disposed for each of the pixels on the bottom transparent substrate 554 is a top-gate type TFT, whose gate electrode 562 is located above an active layer 564. The active layer 564 of the TFT is patterned on the bottom substrate 554 according to known methods in the art. A gate insulating layer 566 overlies and covers the active layer 564. The part of the active layer 564 facing the gate electrode 562 is a channel region 564c. A drain region 564d and a source region 564s with an impurity doped are positioned at respective sides of the channel region 564c. The drain region 564d of the active layer 564 is connected to a data line, which functions also as a drain electrode 566, through a contact hole formed in an interlayer insulating layer 568 covering the gate electrode 562. Also, an insulating layer 570 is disposed to cover the data line and the drain electrode 566. Nanostructure-based transparent conductive features forming the pixel electrode 552 are positioned on the insulating layer 570. The pixel electrode 552 is connected to the source region 564s of the active layer 564 through a contact hole. A first alignment layer 572 may be positioned on the pixel electrode. FIG. 13 further shows a storage capacitance element 574, which can be disposed for each pixel. The storage capacitance element maintains the electric charge corresponding to the display contents, which should be applied to the liquid crystal capacitance, when the TFT is not selected. Therefore, the voltage change of the pixel electrode 552 can be maintained, enabling the display contents to be kept unchanged during one sequence. As shown, the source region 564s of the active layer 564 functions also as a first electrode 576 of the storage capacitance element 574. A second electrode 578 of the storage capacitance element 574 can be formed simultaneously with and in the same layer as the gate electrode 562. The gate insulating layer 566 also works as a dielectric between the first electrode 576 and the second electrode 578. The gate electrode 566 (i.e., gate line) and the second electrode 578 (i.e., a storage capacitance line) are arranged in parallel. They are oriented at a right angle from the pixel electrode 552 to define the matrix of pixels.

It should be understood that for both of the bottom-gate and top-gate TFT configurations, the active layer can be any acceptable semiconductor material. Typically, amorphous silicon is widely used due to the ease and economy of the deposition and patterning steps. Polycrystalline silicon can also be used. Because polycrystalline silicon has better current-driving capability than amorphous silicon, it provides superior performance when used in a switching device. Low temperature deposition of polycrystalline silicon is possible and has been reported as an alternative approach to manufacturing polycrystalline silicon-based TFT, see, e.g., U.S. Pat. No. 7,052,940. In addition, organic semiconductor material can also be used. In certain embodiments, an organic π conjugate compound can be used as the organic semiconductor material that forms the active layer of an organic TFT. The π conjugate compounds are known in the art, which include without limitation: polypyrroles, polythiophenes (may be optionally doped with $C_{60}$), polypyrenes, polyacetylene and polybenzothiophenes, and the like. More examples of the organic semiconductor materials suitable for the organic TFTs are described in, for example, U.S. Pat. No. 7,018,872.

As discussed herein, the TFT backplane is positioned in an LCD opposite to a color filter substrate (see, e.g., FIGS. 24 and 25). The color filter substrate typically comprises a transparent substrate, a black matrix (or a light-shielding layer) and an array of colored pixels. Typically, the colored pixels are arranged on the transparent substrate in a pattern. The black matrix forms a grid around each colored pixel. In certain embodiments, each colored pixel is associated with a color. In other embodiments, each colored pixel can be further divided into smaller colorant areas (referred to as subpixels), each subpixel being associated with a color. Typically, primary colors such as red (R), green (G) and blue (B) are used. For example, repeating arrays of RGB triads are capable of producing color images of a wide variety of colors. The colored pixels or subpixels are not limited to primary colors, other colors such as white, yellow or cyan can also be used.

Depending on the mode of an LCD, the relative positions of the common electrode and the unit color filters can be different in a TN (twisted nematic) mode from that in an IPS (In-plane-switching) mode.

(b) Plasma Display Panel

A plasma display panel emits visible light by exciting fluorescent materials (e.g., phosphors) with ultraviolet light generated by a plasma discharge. The plasma display panel employs two insulating substrates (e.g., glass plates), each insulating substrate having electrodes and barrier ribs formed thereon to define individual cells (pixels). These cells are filled with one or more inert gases (e.g., Xe, Ne or Kr), which can be ionized under an electrical field to produce the plasma. More specifically, address electrodes are formed behind the cells, along a rear glass plate. Transparent display electrodes, along with bus electrodes, are mounted in front of the cells, on a front glass plate. The address electrodes and the transparent display electrodes are orthogonal from one another and cross paths at the cells. In operation, a control circuitry charges the electrodes, creating a voltage difference between the front and back plates and causing the inert gases to ionize and form the plasma.

Metal oxide transparent conductors (e.g., ITO) are conventionally used as the transparent display electrodes on the upper glass plate to allow the plasma-generated visible light through. Nanostructure-based transparent traces are suitable electrode materials for the display electrodes in a PDP. They can be ink jetted as disclosed herein at the required features sizes (e.g., 100-300 µm).

Figure 14:
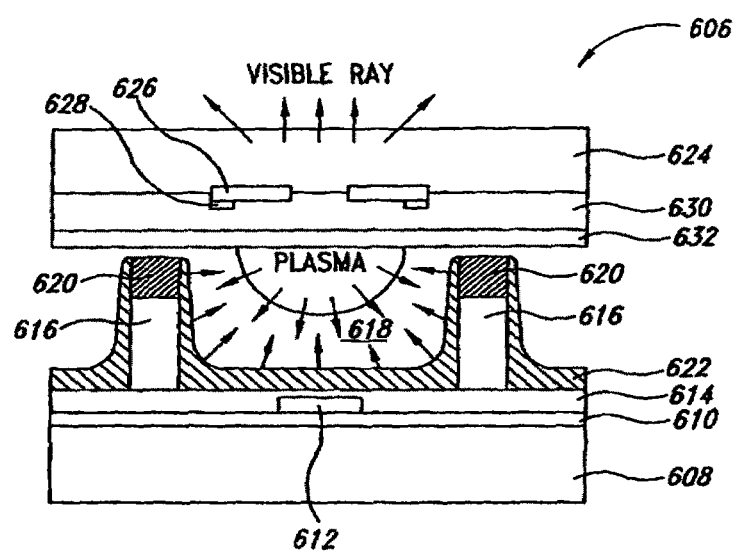
FIG. 14 shows a cross-sectional view of a PDP according to one embodiment.

FIG. 14 shows a cross-sectional view of a PDP according to one embodiment. The PDP 606 includes: a lower transparent substrate 608; a lower insulation layer 610 formed on the lower transparent substrate 608; an address electrode 612 formed on the lower insulation layer 608; a lower dielectric layer 614 formed on the address electrode 612 and the lower insulation layer 610; isolation walls 616 defining a discharging cell 618; black matrix layers 620 positioned on the isolation walls 616; a fluorescent layer 622 formed on the sides of the black matrix layer 620 and the isolation wall 616 and on the lower insulation layer 608; an upper transparent substrate 624; a display electrode 626 formed on the upper transparent substrate 624 and positioned at a right angle in relation to the address electrode 612; a bus electrode 628 formed on a portion of the display electrode 626; an upper dielectric layer 630 formed on the bus electrode 628, the display electrode 626 and the upper transparent substrate 624; and a protection layer (e.g., MgO) 632 formed on the upper dielectric layer 630. The display electrodes can be formed by conductive nanostructure traces deposited according to methods described herein.

It should be understood that the nanostructure-based transparent conductive features are suitable for any other configurations of PDP in which transparent electrodes are positioned on a display panel such that light can transmit with acceptable efficiency to create an image on the display panel.

Photovoltaic Cells

Solar radiation provides a usable energy in the photon range of approximately 0.4 eV to 4 eV. Optoelectronic devices such as photovoltaic (PV) cells can harvest and convert certain photon energies in this range to electrical power. Photovoltaic cells are essentially semiconductor junctions under illumination. Light is absorbed by the semiconductor junction (or diode) and electron-hole pairs are generated on both sides of the junction, i.e., in the n-type emitter and in the p-type base. These charge carriers—electrons from the base and holes from the emitter—then diffuse to the junction and are swept away by the electric field, thus producing electric current across the device. The semiconductor junction can be formed in a homojunction cell by doping a single material (e.g., crystalline silicon) to form p-type and n-type sides. Either PN structure or P-i-N structure can be used.

A heterojunction can be formed by contacting two different semiconductors. Typically, the two semiconductors have different band gaps. The one with the higher bandgap is selected for its transparency and positioned as a top layer or window layer. The one with the lower bandgap forms a bottom layer, which functions as a light-absorbing material. The window layer allows almost all incident light to reach the bottom layer, which readily absorbs light.

Multi-junction cells have been developed to capture a larger portion of the solar spectrum. In this configuration, individual heterojunction cells are stacked in such a way that sunlight falls first on the material having the largest bandgap. Photons not absorbed in the first cell are transmitted to the second cell, which then absorbs the higher-energy portion of the remaining solar radiation while remaining transparent to the lower-energy photons. These selective absorption processes continue through to the final cell, which has the smallest bandgap.

In excitonic PV cells, instead of a p-doped and n-doped region, the materials of different band gaps are used to split and exciton via charge transfer from one semiconductor to the other. After charge separation, the charges are swept away due to built in potential which is created due to the difference in work function between the contact electrodes for charge collection. Organic photovoltaic cells, for example, work this way where one semiconductor can be a polythiophene and the other C60. Polythiophene absorbs light and an exciton is created. The electron jumps from polythiophene to C60 (lower energy state for the electron). The holes move along the polythiophene backbone until they are collected as do the electrons by hopping between buckyballs.

Ohmic metal-semiconductor contacts are provided to both the n-type and p-type sides of the solar cell. In multi-junction cells, they are also interposed between two adjacent cells. Electrons that are created on the n-type side, or have been "collected" by the junction and swept onto the n-type side, may travel through the wire, power the load, and continue through the wire until they reach the p-type semiconductor-metal contact. Because transparent conductors (e.g., ITO) allow light to pass through a window layer to the active light absorbing material beneath, as well as serve as ohmic contacts to transport photo-generated charge carriers away from that light absorbing material, they are desired as contact materials for solar cells.

Figure 15:
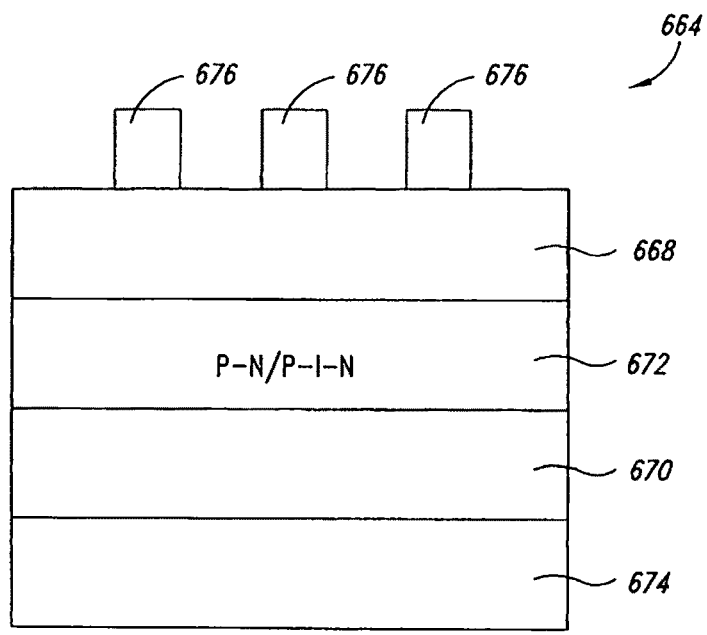
FIG. 15 shows a homojunction solar cell structure according to one embodiment.

FIG. 15 shows a homojunction solar cell 664. The solar cell 644 includes a top contact 668, a bottom contact 670, and a semiconductor diode 672 interposed therebetween. The semiconductor diode can be, for example, a PN structure with the p-doped silicon on the top and N-doped silicon on the bottom. The silicon is typically crystalline silicon. As a more economical alternative, polycrystalline silicon can be used according to known methods in the art. The semiconductor diode can also be formed of amorphous silicon, in which case, a P-i-N structure is preferred.

The top contact is typically optically clear and comprises a light incidence surface, i.e., the surface that light initially enters in the solar cell. Optionally, a substrate 674 can be present underneath the bottom contact 670. Also optionally, bus bars 676 can be formed overlying the top contact. The bus bars 676 can be formed by ink jetting nanostructure-based transparent conductive lines as described herein.

Figure 16:
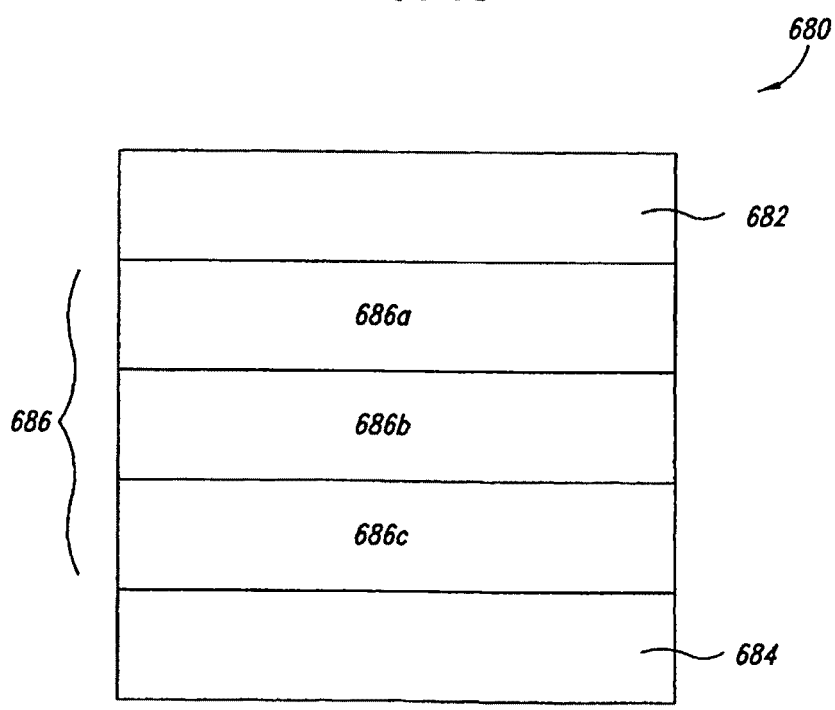
FIG. 16 shows a heterojunction solar cell structure according to another embodiment.

FIG. 16 shows a heterojunction solar cell according to another embodiment. As shown, the heterojunction solar cell 680 includes a top contact 682, a bottom contact 684, and a semiconductor heterojunction layer 686 interposed therebetween.

In certain embodiments, the semiconductor heterojunction layer 686 comprises a three-layer structure (e.g., N-i-P). Thus, it may comprise a doped top semiconductor layer 686a, an undoped middle semiconductor layer 686b and a doped bottom semiconductor layer 686c. In certain embodiment, the first semiconductor layer 686a has a higher bandgap than the third semiconductor layer 686c.

The first, second and third semiconductor layers can be deposited as thin film layers. Suitable semiconductor materials include, but are not limited to, organic semiconductor materials (as discussed herein), cadmium telluride (CdTe), copper indium gallium selenide (CIGS), copper indium selenide (CIS), and the like. For example, in a typical CdTe cell, the top layer is p-type cadmium sulfide (CdS), the middle layer is intrinsic CdTe, and the bottom layer is n-type zinc telluride (ZnTe).

It is also possible for the semiconductor heterojunction layer 686 to include only the top semiconductor layer 686a and the bottom semiconductor layer 686c in a NP structure.

Figure 17:
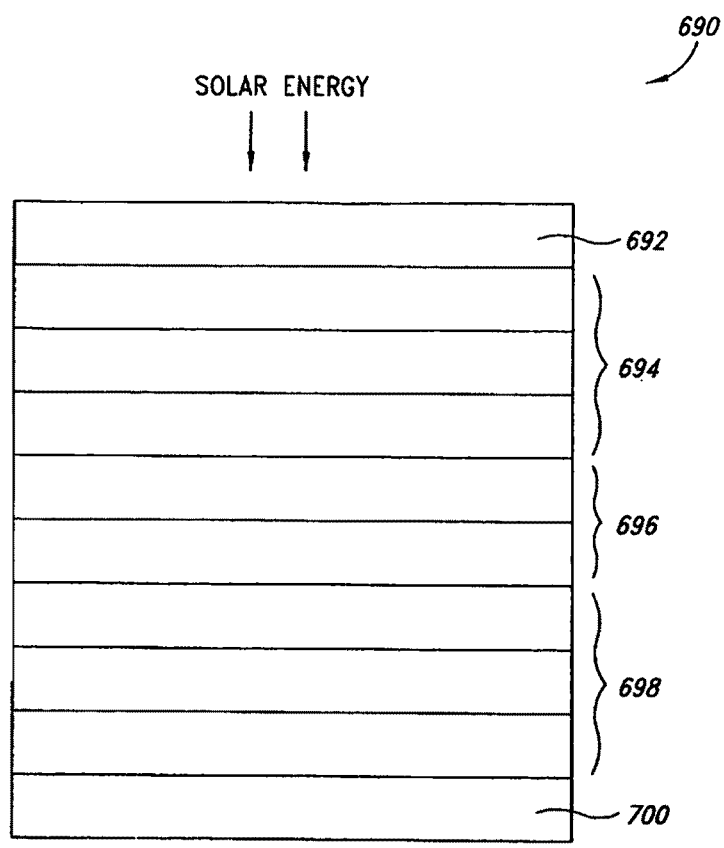
FIG. 17 shows a multi-junction solar cell structure according to another embodiment.

Heterojunction cells based on thin film semiconductor layers save material cost, compared to that of silicon-based solar cells. However, due to inferior performance of thin film semiconductor layers, such devices are less efficient than the polysilicon-based cells in energy conversion. Thus, in one embodiment, a multijunction cell is described in connection with FIG. 17. As shown, the multijunction cell 690 includes, sequentially from top to bottom: a top contact 692, a first cell 694, a tunnel layer 696, a second cell 698 and a bottom contact 700, wherein the top contact 692 and the bottom contact 700 are made of nanostructure-based transparent conductive materials as disclosed herein. For purpose of simplicity, the multijunction cell 690 is shown to include only two cells. It should be understood, however, that additional cells can be fabricated in similar fashion.

Both the first cell 692 and the second cell 698 have similar 3-layer structures as the single junction solar cell 680 shown in FIG. 29B. The first cell is closer to an impinging light and should therefore be selected to have a larger bandgap than that of the second cell. In doing so, the first cell is transparent to the lower energy photons, which can be absorbed by the second cell 698.

The first and second cells are separated by a tunnel layer 696 to allow the flow of electrons between the cells. The tunnel layer 696 can be a PN diode comprising oppositely doped semiconductor layers.

The top contacts 692 and the bottom contacts 700 are nanowire-based transparent conductor films. They can be prepared by the methods described herein. The solar cell 690 can include additional layers such as substrates, bus bars, anti-reflective films and the like, as will be recognized by one skilled in the art. Further, it should be understood that the nanostructure-based transparent conductive materials disclosed herein are suitable as one or more contacts in any solar cell configurations.

EXAMPLES

Example 1

Synthesis of Silver Nanowires

Silver nanowires were synthesized by a reduction of silver nitrate dissolved in ethylene glycol in the presence of poly (vinyl pyrrolidone) (PVP). The method was described in, e.g. Y. Sun, B. Gates, B. Mayers, & Y. Xia, "Crystalline silver nanowires by soft solution processing", *Nanolett*, (2002), 2(2) 165-168. Uniform silver nanowires can be selectively isolated by centrifugation or other known methods.

Alternatively, uniform silver nanowires can be synthesized directly by the addition of a suitable ionic additive (e.g., tetrabutylammonium chloride) to the above reaction mixture. The silver nanowires thus produced can be used directly without a separate step of size-selection. This synthesis is described in more detail in U.S. Provisional Application No. 60/815,627, in the name of Cambrios Technologies Corporation, the assignee of the present application, which application is incorporated herein in it entirety.

Example 2

Preparation of Conductive Coating Solution

Silver nanowires prepared as described herein and purified via sedimentation and solvent exchange and were then allowed to sediment in water for 1 week. The nanowires had lengths of less than 12 um and ranged in diameter from approximately 30 nm to 50 nm. The water was decanted and the sediment nanowires were allowed to fully dry. Propylene glycol, water and Zonyl® FSO were mixed in proportions to form a final coating solution having by weight approximately 55% propylene glycol, 43.5% water, 0.05% Zonyl® FSO and 1.5% silver nanowires and added to the dried silver nanowire sediment. This mixture was filtered through an 11 um nylon mesh filter. The weight percent of silver nanowires was then measured and adjusted to the above percentages by diluting with propylene glycol, water and or Zonyl® FSO.

Example 3

Ink Jet Printing Conductive Features, Electrical and Optical Properties

A Fuji Film Dimatix DMP ink jet printer was provided with the coating solution prepared in Example 2 above. The ink jet printer was configured with a Dimatix ink jet head having 12, 10 pL (27 um diameter) nozzles. The nozzle temperature was set at 50 C and the ink jet printer was driven with a Dimatix Model Fluid 2 waveform generator operating at 80 kHz and a voltage of 20.0 Volts. The target substrate was Eagle 2000 glass and was positioned on a hot plate which was set at 30 C.

Figure 6:
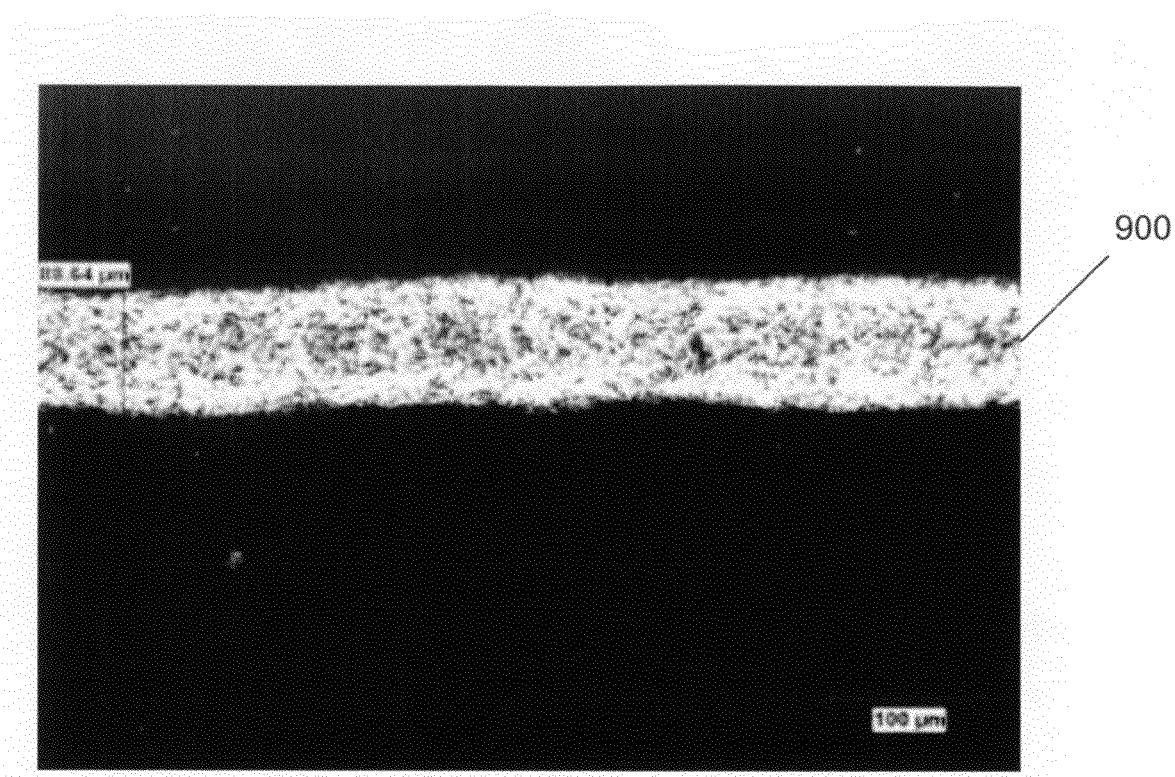
FIG. 6 is a conductive feature including anisotropic, conductive nanostructures in accordance with the present invention.

A first row of drops was applied to the substrate with adjacent drops touching one another. The drops were then allowed to dry. FIG. 6 is a micrograph of the produced line feature 900. This process was repeated 5 times to produce 5, single layer feature lines. Then, additional layers applied in the same manner were overlaid on 4 of the remaining lines to produce one single layer feature line, one three layer feature line, one six layer feature line, one nine layer feature line and one twelve layer feature line. The resistance of each of these five feature lines was then tested using a Keithly Instruments two probe ohmmeter. The five feature lines were then baked at 180° C. for 90 and the surface resistance was once again measured as described above.

The above process of producing single and multi-layered feature lines was then repeated first using the coating solution formulation described above but including 1.5% by weight silver nanowires and next including 2.05% by weight silver nanowires. However, for both the feature lines using the 1.5% silver nanowire coating solution and 2.05% silver nanowire coating solution, lines having 1, 6, 12 and 18 layers were produced. The resistance of each of these eight additionally produced feature lines was measured as described above and the additional feature lines were then baked at 180 C for 90 seconds and the surface resistance of the lines was once again measured.

Figure 7:
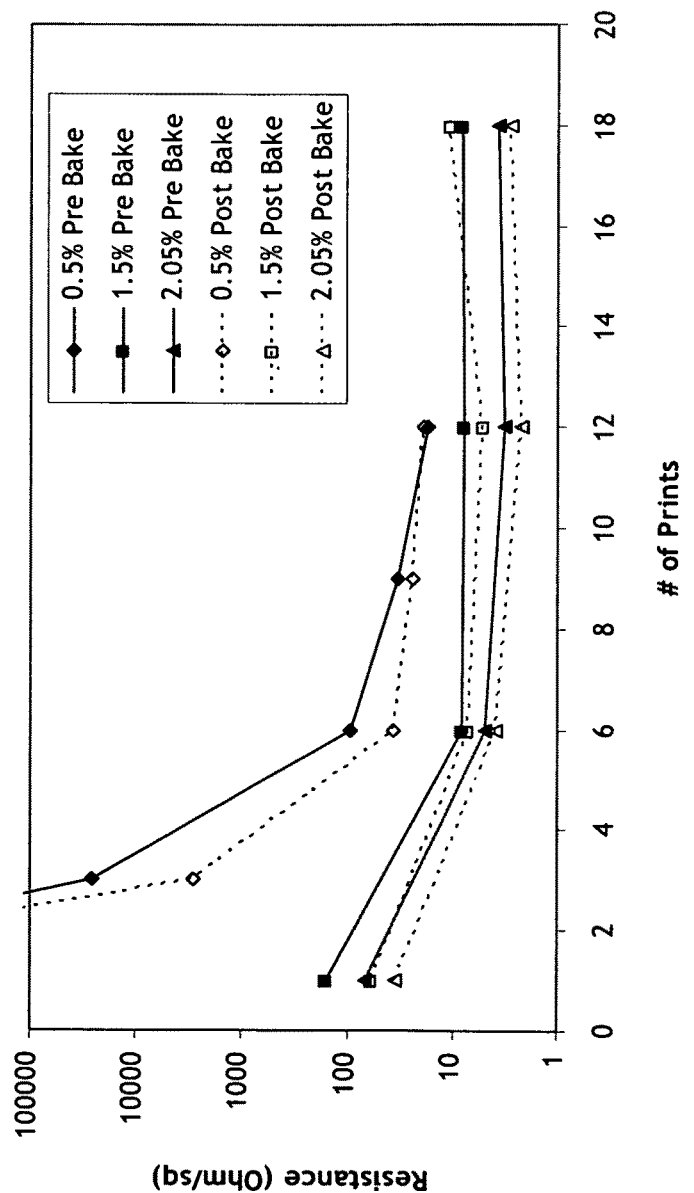
FIG. 7 is a graph illustrating resistances of conductive features produced in accordance with the present invention.

The results of the resistance measurements of the feature lines produced as described above are shown in FIG. 7 in a graph the horizontal axis of which is the number of layers or prints in the measured line and the vertical axis of which is the resistance of the measured line. As shown, the lines formed with coating solutions having a higher percentage silver nanowires displayed a lower surface resistance. Additionally, among samples formed with the same percent nanowire coating solutions, lines having multiple layers of coating displayed a lower surface resistance than lines formed from only a single coating layer.

In addition to measuring the electrical properties of the ink jetted lines, optical properties of lines produced with the coating solution having 1.5% silver nanowires were measured. In particular, Table 1 below shows the results of multiple layers, or prints, of the 1.5% silver nanowire conductive coating solution ink jetted onto the substrate. The "# of Prints" column of Table 1 lists the number of layers of the conductive feature that were applied. The "% T" and "% H" columns list the transmission and haze, respectively, for the corresponding number of prints. The transmission and haze were measured using a BYK Gardner Haze-gard Plus. As shown, the higher the number of prints, the lower the transmission and higher the haze.

TABLE 1

| Formulation | # of Prints | % T | % H |
| --- | --- | --- | --- |
| 1.5% Nanowires | 1 | 90.9 | 1.28 |
| 1.5% Nanowires | 6 | 86.8 | 4.48 |
| 1.5% Nanowires | 12 | 84.1 | 7.08 |

Example 4

Conductive Features by Depositing Non-Touching Drops

Figure 8A:
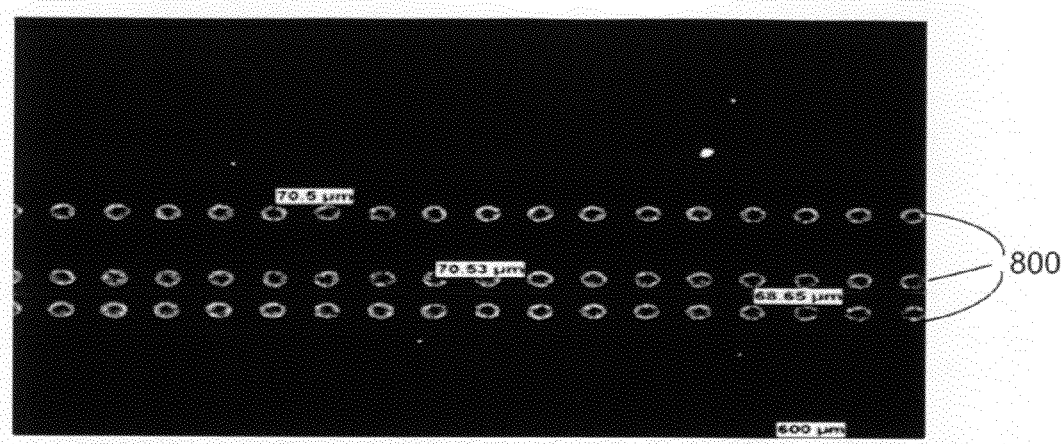
FIGS. 8A and 8B are micrographs illustrating an embodiment of a method of producing conductive features in accordance with the present invention.
Figure 8B:
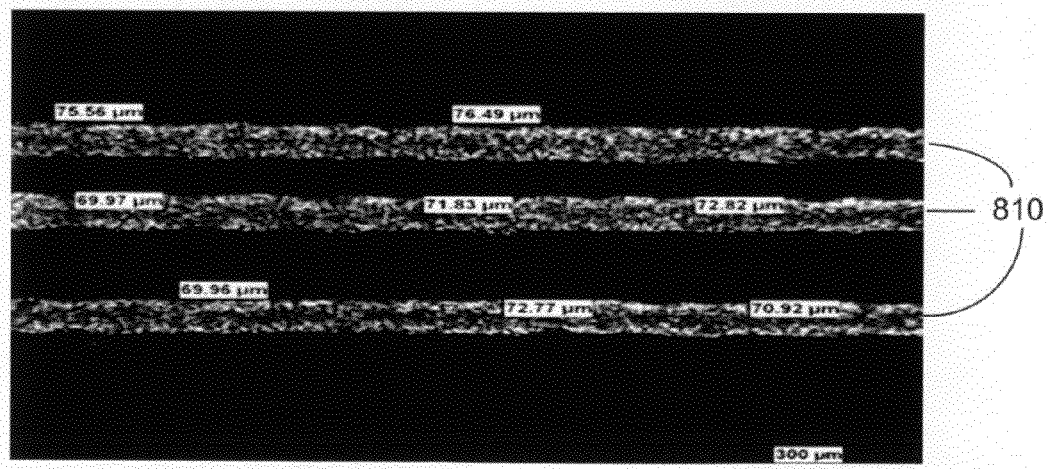

Using the coating solution described in Example 2 above and the coating parameters and substrate described in Example 3 above, a first row of drops was applied to the substrate, the drops having a diameter of approximately 70 um with a spacing between the closest edges of the drops of approximately 75 um. FIG. 8A is a micrograph showing first rows 800 of deposited drops. As shown, drops in first rows 800 did not touch each other. The drops were allowed to dry for 50 seconds after deposition. Then, a second line of drops having the same approximate diameter and spacing as the drops in the first rows were deposited between the first, dried line of drops and allowed to dry for at least 50 seconds, to form a single, continuous feature line. FIG. 8B is a micrograph showing the resulting feature lines 810. As shown the width of feature lines 810 vary from at least approximately 69.97 um to approximately 76.49 um.

Example 5

Substrate Pretreatment

Figure 9B:
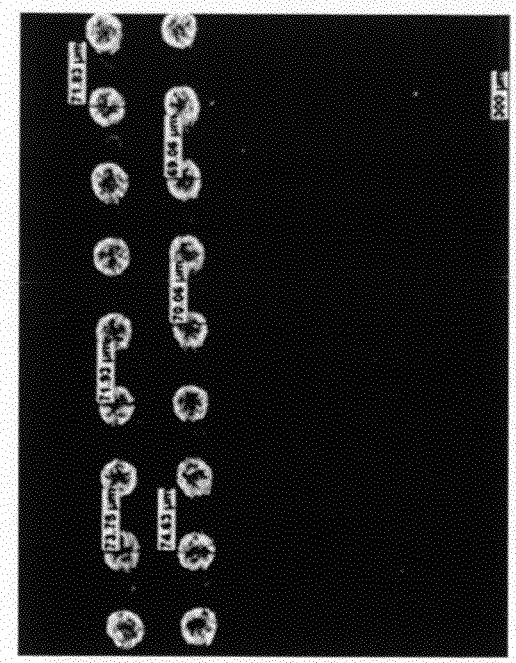
FIGS. 9A and 9B are micrographs illustrating an embodiment of a method of producing conductive features in accordance with the present invention.
Figure 9A:
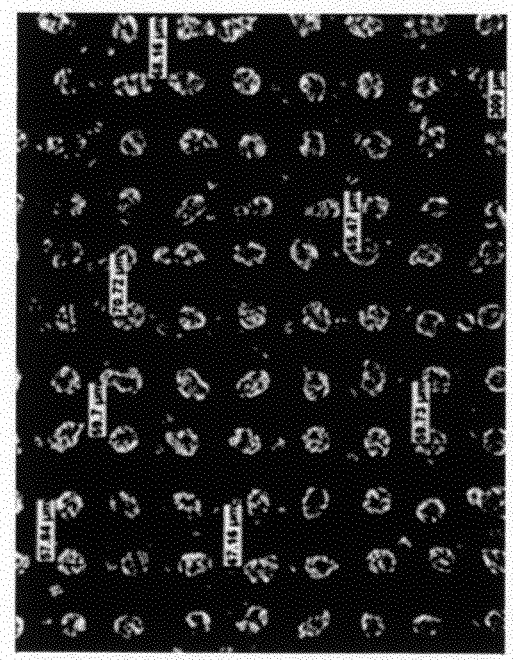

FIG. 9A is a micrograph of the coating solution of Example 2 above including conductive nanostructures of Example 2 above coated on a Eagle 2000 glass substrate using the coating parameters of Example 3 above and that has not been treated with UV Ozone or $O_2$ plasma. As shown, the shape of the deposited drops are not uniform and the diameters of the drops is not uniform. In particular, the diameters of the drops range at least from approximately 55.47 um to approximately 70.72 um. FIG. 9B is a micrograph of the coating solution of Example 2 above including conductive nanostructures coated on an Eagle 2000 glass substrate using the coating parameters for Example 3 above and that was further exposed to UV Ozone for 10 minutes prior to deposition of drops. As shown, the deposited drops of coating solution have a generally more uniform shape and the diameters of the drops is more uniform, with diameters ranging from at least approximately 70.06 um to approximately 74.63 um.

Example 6

Feature Lines Printed with 1 pL (9 um) Nozzle

A Fuji Film Dimatix DMP ink jet printer was provided with the coating solution prepared in Example 2 above. The ink jet printer was configured with a Dimatix ink jet head having 12, 1 pL (9 um diameter) nozzles. The nozzle temperature was set at 50 C and the ink jet printer was driven with a Dimatix Model Fluid 2 waveform generator operating at 80 kHz and a voltage of 20.0 Volts. The target substrate was Eagle 2000 glass and was positioned on a hot plate which was set at 30 C.

Figure 10:
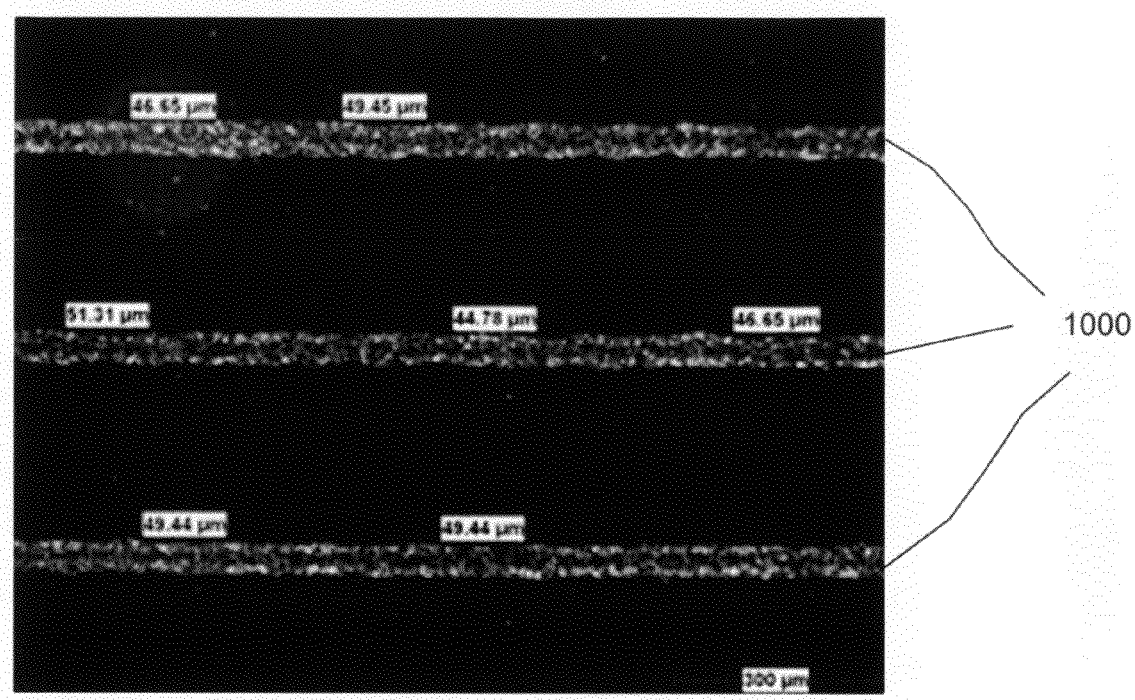
FIG. 10 is a micrograph illustrating conductive features produced in accordance with the present invention.

A first row of drops was applied to the substrate, the drops having a diameter of approximately 45 um with a spacing between the closest edges of the drops of approximately 30 um. As such, drops in first rows did not touch each other. The drops were allowed to dry for 5 seconds after deposition. Then, a second line of drops having the same approximate diameter and spacing as the drops in the first rows were deposited between the first, dried line of drops and allowed to dry for at least 5 seconds, to form single, continuous feature lines. FIG. 10 is a micrograph showing the resulting feature lines 1000. As shown the width of feature lines 1000 vary from at least approximately 44.78 um to approximately 51.31 um.

Example 7

Optical and Electrical Properties of Ink Jetted Features 152 mm by 152 mm transparent conductive samples were prepared on a substrate as described in Example 3 above. Only single layer of coating solution was deposited for each sample. After dispensing, sample #1 was air dried at room temperature, sample #2 was partially dried at room temperature followed by drying for 1 minute on a 60 C hot plate. The third sample was immediately dried at 60 C for 1 minute. The resistance of each line was then taken using a Delcom. All three samples were then baked on a hot plate at 80 C for 120 seconds and the resistance of each sample was taken near each corner of the samples, near the center of the samples and along each edge of the samples. Additionally, post bake, the transparency of each sample was measured using a BYK Gardner Haze-gard Plus over a range of wavelengths from approximately 400 nm to approximately 700 nm. Also, the haze of each sample was taken using the Gardner Haze-gard using white light. The results of the measurements are show in Table 2 below.

TABLE 2

| Sample # | Wavelength | % T @ Wavelength | % H | R (Ohms/sq) Delcom Pre Bake | R (Ohms/sq) Delcom Post Bake | | |
|---|---|---|---|---|---|---|---|
| 1 | 400 nm | 85.31 | 1.72 | >10000 | 370 | 333 | 303 |
|   | 550 nm | 88.95 |      |         | 384 | 384 | 625 |
|   | 700 nm | 88.71 |      |         | 500 | 625 | 555 |
| 3 | 400 nm | 80.92 | 2.25 | 2500    | 294 | 222 | 181 |
|   | 550 nm | 86.10 |      |         | 588 | 277 | 181 |
|   | 700 nm | 85.91 |      |         | 370 | 185 | 434 |
| 4 | 400 nm | 72.36 | 2.24 | 3300    | 202 | 208 | 185 |
|   | 550 nm | 84.92 |      |         | 333 | 192 | 476 |
|   | 700 nm | 86.29 |      |         | 303 | 400 | 294 |

As shown, post bake resistances varied from 181 ohms/sq to 625 ohms/sq. Haze ranged from 1.72% to 2.24% and transmission varied from 72.36% to 88.95%.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A coating composition for ink jet printing including:
   a first solvent;
   a second solvent;
   a fluorosurfactant in an amount from 200 ppm-800 ppm of the coating composition; and
   from 0.1% to 5% of metallic anisotropic nanostructures;
   wherein:
   the ratio by weight of the first solvent to the nanostructures is from 7 to 750;
   the ratio by weight of the second solvent to the nanostructures is from 5 to 650; and
   the ratio by weight of the surfactant to the nanostructures is from 0.001 to 5.

2. The coating composition of claim 1 including from 400 to 600 ppm fluorosurfactant.

3. The coating composition of claim 1 having a boiling point from 100° C. to 180° C.

4. The coating composition of claim 1 having from 1% to 2% by weight nanostructures.

5. The coating composition of claim 1 wherein the first solvent is water, isopropanol, propylene glycol, or ethylene glycol.

6. The coating composition of claim 1 wherein the second solvent is water, isopropanol, propylene glycol, or ethylene glycol.

7. The coating composition of claim 1 wherein the surfactant comprises lithium 3-[2-(perfluoroalkyl)ethylthio]propionate, or $(C_2H_4O)_x(CF_2)_yC_2H_5FO$.

8. The coating composition of claim 1 wherein the metallic anisotropic nanostructures are metallic nanowires or metallic nanotubes.

9. The coating composition of claim 8 wherein the metallic anisotropic nanostructures are silver nanowires or gold nanotubes.

10. The coating composition of claim 1 wherein:
   the ratio by weight of the first solvent to the nanostructures is from 25 to 60;
   the ratio by weight of the second solvent to the nanostructures is from 40 to 50; and
   the ratio by weight of the surfactant to the nanostructures is from 0.005 to 0.1.

\* \* \* \* \*